United States Patent [19]

Tanimoto

[11] Patent Number: 4,470,133
[45] Date of Patent: Sep. 4, 1984

[54] MEMORY CIRCUIT HAVING A DECODER

[75] Inventor: Kazuo Tanimoto, Tama, Japan

[73] Assignee: Fujitsu Limited, Kawasaki, Japan

[21] Appl. No.: 331,289

[22] Filed: Dec. 16, 1981

[30] Foreign Application Priority Data

Dec. 29, 1980 [JP] Japan .................................. 55-187955

[51] Int. Cl.³ .............................................. G11C 7/00
[52] U.S. Cl. ..................................... 365/227; 365/231
[58] Field of Search ............... 365/189, 174, 220, 221, 365/226, 227, 230, 231; 307/238.4, 238.8, 238.5, DIG. 5

[56] References Cited

U.S. PATENT DOCUMENTS

| | | | |
|---|---|---|---|
| 3,703,710 | 11/1972 | Kubo et al. ..................... | 365/227 X |
| 3,750,116 | 7/1973 | Kemerer ........................ | 365/227 X |
| 3,803,554 | 4/1974 | Bock et al. ..................... | 365/227 X |
| 3,815,106 | 6/1974 | Wiedmann ...................... | 365/227 X |
| 4,387,449 | 6/1983 | Masuda ............................. | 365/227 |

Primary Examiner—Robert L. Richardson
Attorney, Agent, or Firm—Staas & Halsey

[57] ABSTRACT

A memory circuit has a decoder circuit for receiving address signals and generating word designating signals. The decoder circuit has a plurality of decoder circuit blocks and includes a circuit for receiving some of the address signals and generating signals designating one of the decoder circuit blocks, whereby the current flowing in each of the decoder circuit blocks is reduced as long as the blocks are not designated.

3 Claims, 6 Drawing Figures

MEMORY CIRCUIT HAVING A DECODER

BACKGROUND OF THE INVENTION

1. Field of the Invention

This invention relates to a memory circuit, and more particularly to a memory circuit having a decoder of small power consumption.

2. Description of the Prior Art

Generally, one-bit data are written into and read from memory circuit in the following manner. First, n-bit binary address signals are supplied to a decoding circuit. Then a decoding circuit decodes the n-bit binary signals, thus enabling only that word line out of $2^n$ word lines which have been address-designated. Through the enabled word line one-bit data are supplied to or from the memory cell of the memory circuit.

Such a known memory circuit is shown in FIG. 1. Binary address signals $A_0, A_1, \ldots A_{n-1}$ are supplied to address buffers 1. The address buffers 1 generate signals $A_i$ ($i=0, 1, \ldots n-1$) and signals $\overline{A}_i$ ($i=0, 1, \ldots n-1$) obtained by inverting the signals $A_i$. The signals $A_i$ and the signals $\overline{A}_i$ are supplied to decoder 2. The decoder 2 has output lines $W_j$ ($j=0, 1, \ldots 2^n-1$) which are connected respectively to rows of memory cells constituting a memory cell array 3. Thus an output signal of the decoder 2 designates the cells of one row.

The decoder 2 comprises a plurality of decoding circuits 20 to which the output lines $W_j$ are connected, respectively. Each decoding circuit 20 is supplied with signals at point 201 (indicated by black dots in the drawing). When all the binary address signals $A_i$ have a logic value "0" and thus designate a 0th address, the word line $W_0$ of the decoder circuit 2 is enabled. In this case the decoder unit 20 functions as a NOR circuit.

The memory circuit further comprises a chip selection terminal $\overline{CS}$. The terminal $\overline{CS}$ is connected to a CS buffer IC, whose inverted output signal CS is supplied to all the decoding circuits 20 of the decoder 2. Thus, when a chip selection signal $\overline{CS}$ supplied to the chip selection terminal $\overline{CS}$, all the word lines $W_j$ are disabled and all the decoding circuits 20 are also disabled. As a result, no data can be written into or read from the memory cell array 3.

Each decoding circuit 20 of the known decoder 2 is shown in FIG. 2. As shown in FIG. 2, the decoding circuit 20 comprises MOS transistors. It functions as a NOR circuit and supplies an output of a logic value "1" through its word line WD only when a chip selection signal CS has a logic value "1" and, at the same time, all the address signals $A_0, A_1, \ldots A_{n-1}$ have a logic value "0". More specifically, when transistors $Q_0$–$Q_{n-1}$ are off and a transistor $T_1$ is on, a transistor $T_2$ is turned on because its gate terminal receives a power source voltage $V_{CC}$ through a load MOS transistor $T_3$. Since the gate terminal of a transistor $T_4$ receives a low-level output from an inverting transistor $T_5$ which receives a high-level input signal and since the transistor $T_2$ is on, a chip selection signal CS of a logic level "1" appears in the word line WD. It follows that the decoding circuit 20 is selected and that the 0th address is designated.

Conversely, when at least one of the address signals $A_0$–$A_{n-1}$ has a logic value "1", the transistor $Q_0, Q_1, \ldots$ or $Q_{n-1}$ which receives the address signal is turned on. As a result, the transistor $T_5$ is turned off and the transistor $T_4$ is turned on. Consequently current flows along a route constituted by the transistor $T_3$, the transistor $T_1$ and the transistor $Q_i$ ($i=0, 1, \ldots$ or $n-1$) which is on. A chip selection signal CS of a logic value "0" therefore appears in the word line WD.

In the above-mentioned decoding circuit 20 current inevitably flows along the route consisting of $T_3$, $T_1$ and at least one transistor $Q_i$ ($i=0, 1, \ldots$ or $n-1$).

In the known decoder 2, $N-1$ word lines out of N word lines corresponding to the total number N of memory words ($N=2^n$) are not selected and are kept at logic "0". Obviously there must flow within the decoder 2 an electric current which keeps the non-selected word lines at logic value "0". Hence the decoding circuit 20 consumes much power. In the existing static RAM, for instance, such a decoder uses up about 35% of the power that the whole RAM consumes.

SUMMARY OF THE INVENTION

Accordingly it is an object of the present invention to provide a memory circuit with a decoder which comprises a plurality of blocks and in which no current is supplied to any block that is disabled, thereby reducing the power consumption.

According to the invention there is provided a memory circuit having a decoder, characterized in that the decoder comprises a plurality of blocks, each block including a plurality of decoding circuits for selecting word lines, and that the memory circuit also includes means for selecting one of the plurality of blocks, whereby only one block to which a selected word line belongs is rendered active according to address signals.

DETAILED DESCRIPTION OF THE PREFERRED EMBODIMENTS

Now referring to the accompanying drawings the embodiments of the invention will be described.

Figure 3A:
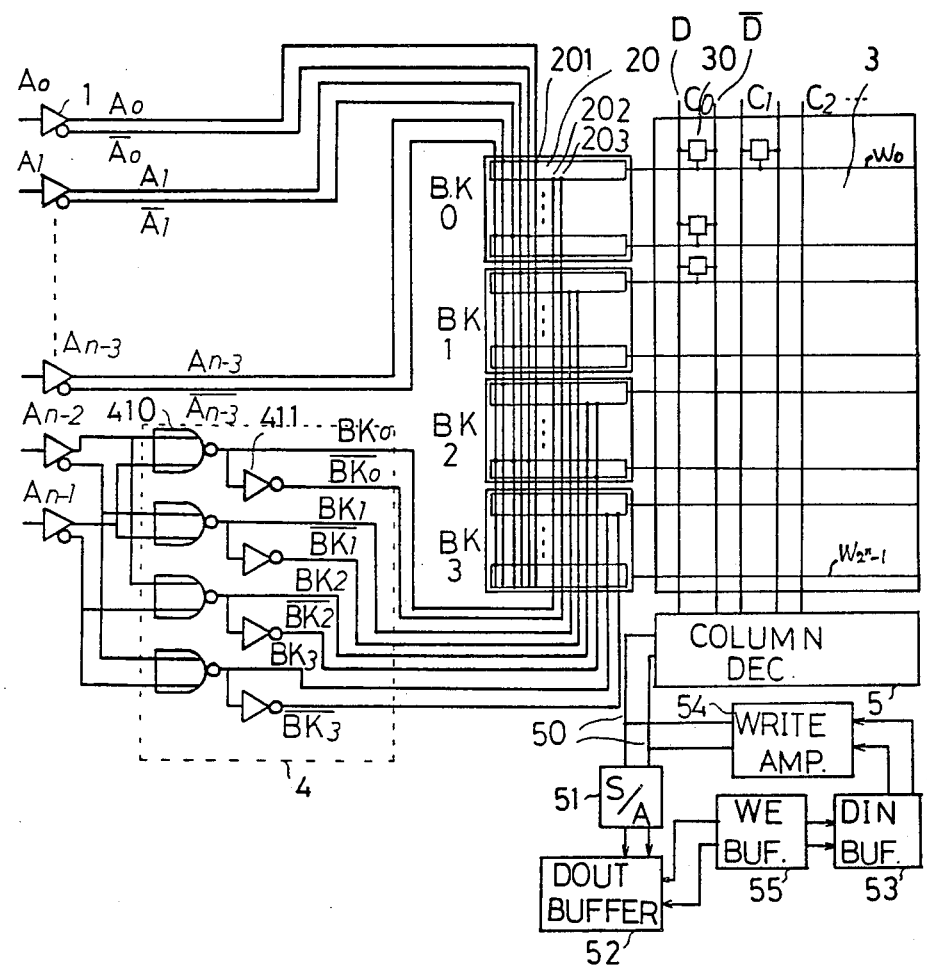
FIG. 3A is a block diagram of a memory circuit having a decoder according to the present invention.

FIG. 3A shows a memory circuit according to the present invention. Binary address signals $A_0, A_1, \ldots A_{n-1}$ are supplied to address buffers 1. The address buffers 1 generate signals $A_i$ ($i=0, 1, \ldots n-3$) and signals $\overline{A}_i$ ($i=0, 1, \ldots n-3$) obtained by inverting the signals $A_i$. These signals $A_i$ and $\overline{A}_i$ are supplied to a NOR type decoder 2. The NOR type decoder has output lines $W_j$ ($j=0, 1, \ldots 2^n-1$). The output lines or word line $W_j$ are connected respectively to rows of memory cells constituting a memory cell array 3. Hence each output line or word-line $W_j$ designates the corresponding row of cells when it is enabled.

The NOR type decoder 2 comprises a plurality of decoding circuits 20 to which the output lines $W_j$ are connected, respectively. When all the address signals $A_i$ have a logic value "0" and thus designate the 0th address, the output line or word line $W_0$ is enabled and is turned to a logic value "1". In this case, therefore, the decoding circuit 20 functions as a NOR circuit.

In the read mode, when one of the word lines $W_j$ (i=0, ... $2^{n-1}$), for example, the word line $W_0$ is at a logic "1", the content of all the memory cells 30 connected to the word line $W_0$ and aligned in a row direction in the memory cell array are inclined to be read out through all of the bit lines D and $\overline{D}$. However, actually only one column, for example, column $C_0$ is designated by a column decoder 5 and thus, the content of only the memory cell connected to the word line $W_0$ and connected to the bit lines D and $\overline{D}$ for column $C_0$ is output through a route of the output line 50 of the column decoder 5, the sense amplifier 51 and the data output buffer 52.

In the write mode, the data input through a data input buffer 53 and a write amplifier 54 is written in, for example, a memory cell connected to the word line $W_0$ activated by the decoder 2 and connected to a column $C_0$ designated by the column decoder 5. A write-enable buffer 55 controls the data input buffer 53 to form a write-enable condition and also controls the data output buffer circuit 52 to obtain the output data.

As shown in FIG. 3A, the decoder circuit 2 comprises four blocks 0 to 3, each of which is designated by two address signals $A_{n-1}$ and $A_{n-2}$. The address signals $A_{n-1}$ and $A_{n-2}$ are supplied to the address buffers 1. The address buffer 1 generates two output signals $A_{n-1}$ and $A_{n-2}$ and two more output signals $\overline{A}_{n-1}$ and $\overline{A}_{n-2}$ are obtained by inverting the signals $A_{n-1}$ and $A_{n-2}$. These four signals $A_{n-1}$, $A_{n-2}$, $\overline{A}_{n-1}$ and $\overline{A}_{n-2}$ are supplied to a two-bit decoder circuit 4. The two-bit decoder circuit 4 generates four signals $BK_0$, $BK_1$, $BK_2$ and $BK_3$ and four more signals $\overline{BK}_0$, $\overline{BK}_1$, $\overline{BK}_2$ and $\overline{BK}_3$ obtained by inverting the signals $BK_0$, $BK_1$, $BK_2$ and $BK_3$, by using NOR circuits 410 and inverters 411. The signals $BK_0$ and $\overline{BK}_0$ are coupled to the decoding circuits 20 of the block 0. Similarly, the signals $BK_1$ and $\overline{BK}_1$ are coupled to the decoding circuits 20 of the block 1, the signals $BK_2$ and $\overline{BK}_2$ to the decoding circuits 20 of the block 2, and the signals $BK_3$ and $\overline{BK}_3$ to the decoding circuits 20 of the block 3.

When both most significant address signals $A_{n-1}$ and $A_{n-2}$ have a logic "0", only the output signal $BK_0$ of the two-bit decoder circuit 4 among the output signals $BK_0$, $BK_1$, $BK_2$ and $BK_3$ has a logic "1". Hence, the signal $\overline{BK}_0$ has a logic value "0". As a result, all the decoding circuits 20 of the block 0 are enabled. Only one of the word lines of the block 0 which are designated by the lower significant address signals $A_0$–$A_{n-3}$ is enabled, whereby data may be written into or read from the memory cell which is designated by the enabled word line. In this case where the address signals $A_{n-1}$ and $A_{n-2}$ have a logic value "0", the signals $BK_1$, $BK_2$ and $BK_3$ are inactive. Therefore, the word lines of the blocks 1, 2 and 3 are disabled and thus inactive. The current flowing to each block thus rendered inactive is extremely small, almost zero. More precisely, the current flowing to the decoding circuits 20 of each block in an inactive state is reduced nearly to zero.

Figure 3B:
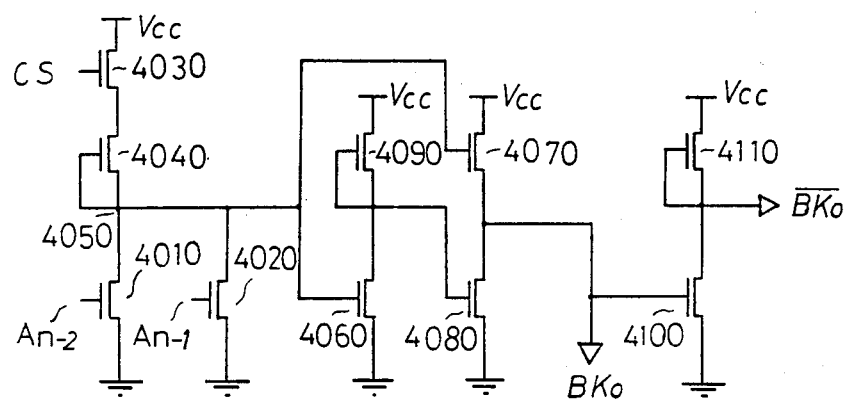
FIG. 3B is a circuit diagram of a driver circuit used in the memory circuit of FIG. 3A for driving the decoder thereof.

The detailed circuit diagram of the NOR circuit 410 and the inverter 411 in the decoder circuit 4 is shown in FIG. 3B, using MOS transistors.

Assume that the block designating signals $BK_0$ and $\overline{BK}_0$ are output from the decoder circuit 4. The address signals $A_{n-1}$ and $A_{n-2}$ are input to the respective gates of the transistor 4010 and 4020. When at least one of the signals $A_{n-1}$ and $A_{n-2}$ is at the logic "1", either of transistors 4010 and 4020 is turned on. Then, if the chip select signal CS is at the logic "1", a transistor 4030 is turned on, thereby causing current to flow through a load transistor 4040. Thus, the cross point 4050 becomes the logic "0", thereby turning the transistors 4060 and 4070 off. As current does not flow through a load transistor 4090, the gate of a transistor 4080 comes up to a high level, i.e., logic "1", and is caused to turn on. Thus, the block designating signal $BK_0$ is a low level, i.e. logic "0". Then as a transistor 4100 is turned off, the block designating signal $\overline{BK}_0$ is turned to a logic "1".

If both of the address signals $A_{n-1}$ and $A_{n-2}$ input to the transistors 4010 and 4020 are at the logic "0", the transistors 4060 and 4070 are turned on as they have high level signals at their gates, causing the transistor 4080 to turn off. Thus, the block designating signal $BK_0$ becomes the logic "1". At the same time the transistor 4100 is turned on, thereby causing the block designating signal $\overline{BK}_0$ to have a logic "0".

As described above, the block designating signal $BK_0$ is output as the output of the NOR circuit when the address input signals $A_{n-2}$ and $A_{n-1}$ are input thereto. And the signal $\overline{BK}_0$ is the inverted signal of the signal $BK_0$.

Figure 1:
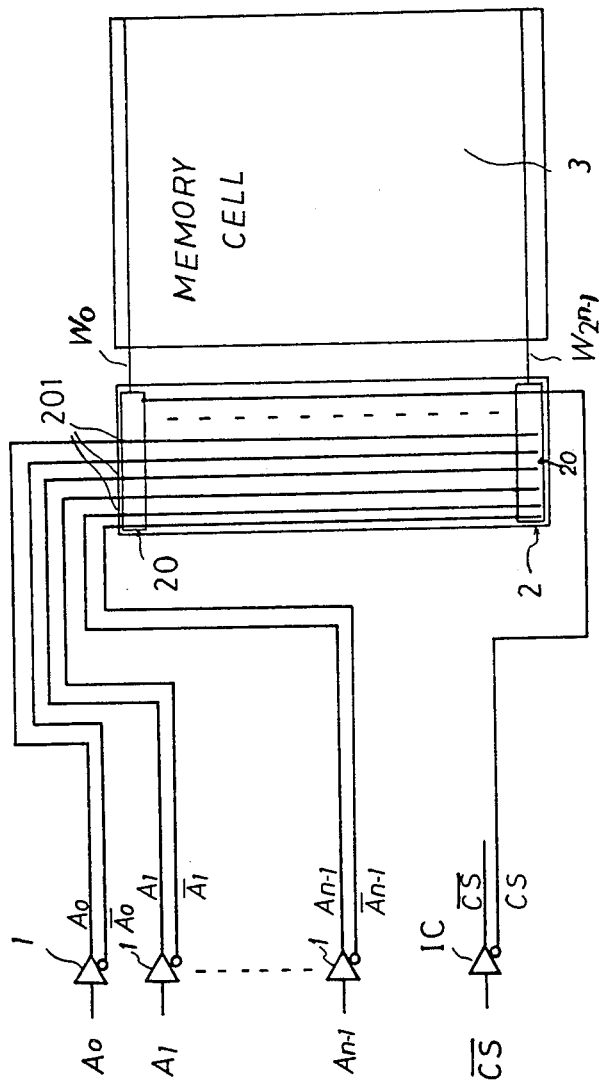
FIG. 1 is a block diagram of a memory circuit having a known decoder.
Figure 2:
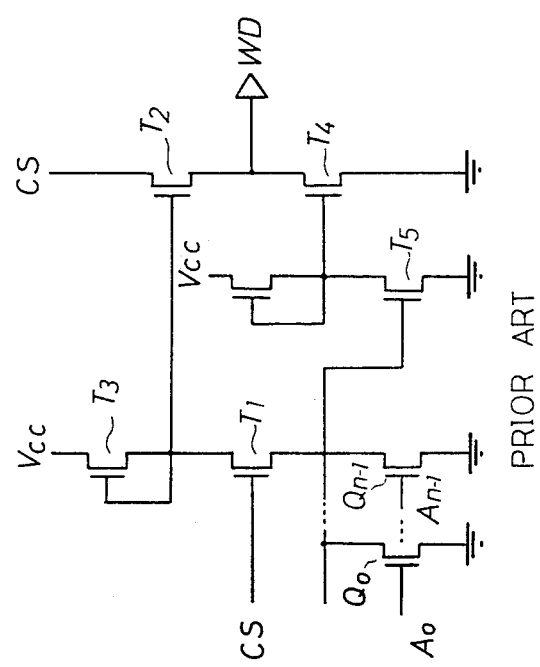
FIG. 2 is a circuit diagram of the decoding circuit of the memory circuit shown in FIG. 1.
Figure 4:
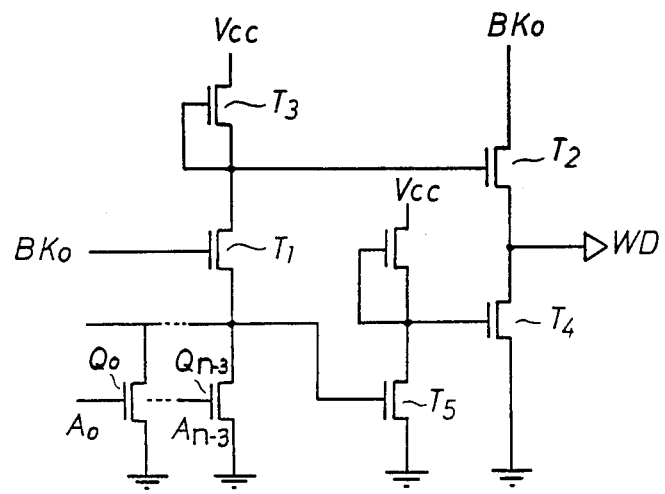
FIG. 4 is a circuit diagram of the decoding circuit of the memory circuit shown in FIG. 3A.

FIG. 4 shows each of the decoding circuits 20 used in the memory circuit shown in FIG. 3A. In FIG. 4, like numerals are used to denote like elements as shown in FIG. 2 and are not described in detail. More precisely, the decoding circuit of FIG. 4 is one of the decoding circuits 20 of the block 0 of the memory circuit shown in FIG. 3A. The signal $BK_0$ which designates the block 0 is supplied to the gate of transistor $T_1$ and the drain of a transistor $T_2$. But the output signal $\overline{BK}_0$ of the decoder circuit 4 is not supplied to the decoding circuit 20.

The decoding circuit 20 supplies an output of a logic value "1" through its word line WD only when the block designating signal $BK_0$ has a logic value "1" and, at the same time, all the address signals $A_0$–$A_{n-3}$ have a logic value "0". In this respect the decoding circuit 20 is similar to the decoding circuit 20 shown in FIG. 2. When at least one of the address signals $A_0$–$A_{n-3}$ has a logic value "1", the decoding circuit 20 supplies an output of a logic value "0" through its word line WD. Accordingly, the decoding circuit 20 functions as a NOR circuit.

As shown in FIG. 4, the drain of the transistor $T_2$ of the decoding circuit 20 is connected to a signal line for supplying the block designating signal $BK_0$ to the block 0. Therefore, when the word line WD (i.e. output line $W_0$ in FIG. 3A) is rendered active, the rising of the output signal is inevitably delayed and becomes unstable.

Figure 5:
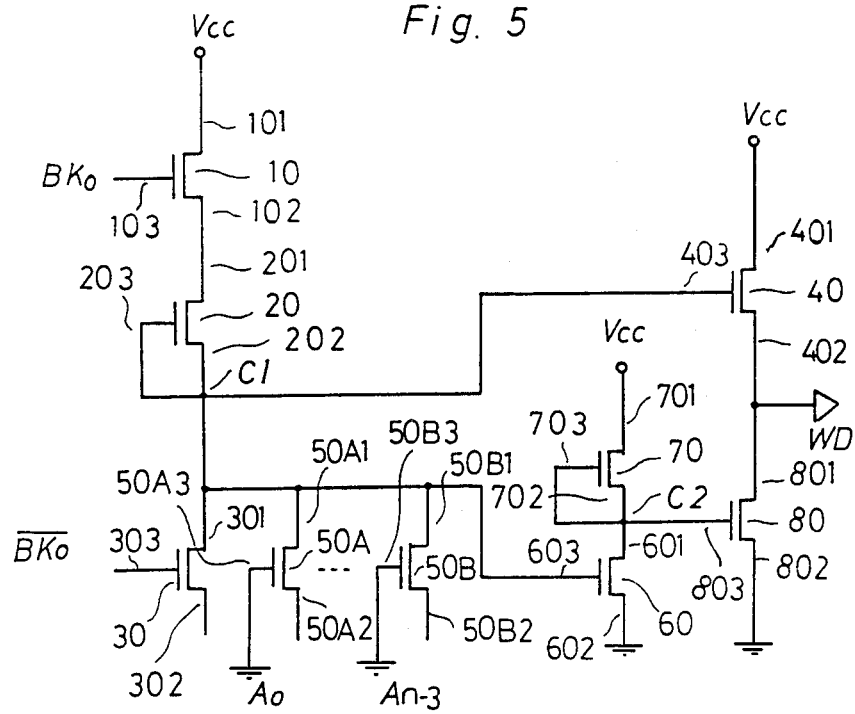
FIG. 5 is a circuit diagram of a decoding circuit according to another embodiment of the present invention.

FIG. 5 shows another decoding circuit 20 which eliminates the above-mentioned drawback of the decoding circuit 20 shown in FIG. 4. As shown in FIG. 5, this decoding circuit has a transistor 10 having a gate 103 which receives a block designating signal $BK_0$ having a drain 101 which is connected to a voltage source $V_{CC}$, a transistor 20 having a drain 201 which is connected to the source 102 of the transistor 10 and the gate 203 and source 202 of which are connected to each other, and a transistor 30 having a drain 301 which is connected to the source 202 of the transistor 20, having a source 302 which is grounded and having a gate 303 which is coupled to receive a signal $\overline{BK}_0$ obtained by inverting the block designating signal $BK_0$. The decoding circuit further comprises a transistor 40 having a gate 403 connected to the source 202 of the transistor 20, having a drain 401 coupled to the voltage source $V_{CC}$ and having a source 402 connected to the word line WD. The decoding circuit still further comprises a plurality of transistors 50A to 50B. To gates 50A3 to 50B3 of these transistors 50A to 50B, the address signals $A_0$ to $A_{n-3}$ are respectively applied. The drains 50A1 to 50B1 of the transistors 50A to 50B are connected commonly to the source 202 of the transistor 20, and the sources 50A2 to 50B2 are connected commonly to the ground.

The decoding circuit of FIG. 5 is further provided with a transistor 60 whose gate 603 is connected to the drains 50A1 to 50B1 of the n−2 transistors 50A to 50B and whose drain 601 is connected to a gate 703 and source 702 of a load MOS transistor 70, the drain of which is coupled to the voltage source $V_{CC}$. The source 602 of the transistor 60 is grounded. Still another transistor 80 is provided, having a gate 803 connected to the drain 601 of the transistor 60, having a drain 801 connected to the word line WD and having a source 802 connected to ground.

As illustrated in FIG. 3A, the block 0 of the decoder 2 is comprised of a plurality of decoding circuits 20 which may be the same as the decoding circuits shown in FIG. 5. Each of the decoding circuits 20 of block 1 is connected to receive two block designating signals $BK_0$ and $\overline{BK_0}$. The logic values of these signals $BK_0$ and $\overline{BK_0}$ determine whether or not the block 0 is rendered active or selected. Hence, only those of the blocks 0 to 3 which are selected become operative, and the non-selected blocks remain in-operative.

In the decoding circuit of FIG. 5, the block designating signal $BK_0$ is fed to the gate 103 of the transistor 10 and the reversed block designating signal $\overline{BK_0}$ to the gate 303 of the transistor 30. The word line WD of the decoding circuit is selected when all the word address signals $A_1$–$A_{n-3}$ are set to a low level (i.e. logical value "0"), and at the same time, both address lines $A_{n-1}$ and $A_{n-2}$ have a logic value "0". Thus, when the word line WD is selected, the signal $BK_0$ is at a high level and the signal $\overline{BK_0}$ is at a low level, whereby the 0th address of the block 0, i.e. word line $W_0$, is rendered active. Then, the transistor is turned on, and the transistor 30 and the transistors 50A–50B receive the address signals and function as NOR circuits. As a result, no drain current flows in the transistor 10 or 20 and a voltage of $V_{CC}$ appears at a node C1 and thus sets the node C1 to a high level. At this time a high-level voltage is applied to the gate 603 of the transistor 60, and current flows to the drain 601 of the transistor 60 through the load MOS transistor 70. Consequently, a high-level voltage is applied to the gate 403 of the transistor 40 and a low-level voltage is applied to the gate 803 of the transistor 80. The transistors 40 and 80 are thus turned on and off, respectively. An output of a logic value "1" is therefore supplied through the word line WD. As can be well understood from the above, as long as none of the word address lines WA are selected, no drain current flows through the transistor 60. This is why it is possible with the memory circuit of this invention to reduce the power consumption.

Conversely, the block designating signal $BK_0$ has a low level and the block designating signal $\overline{BK_0}$ has a high level when the block 0 is not selected. In this case, the word address lines WA are set to either a high level or a low level, the transistor 10 is turned off, and no current flows through the transistor 10. As a result, the node C1 is set to a low level and the node C2 is set to a high level. An output of a logic value "0" is therefore supplied through the word line WD which is now set to a low level. If this is the case, the block 0 consumes no power.

The memory circuit is so designed that the block designating signal $BK_0$ is at a low level when a chip selection signal $\overline{CS}$ is at a high level. Hence, when the block designating signal $BK_0$ has a low level, the block 0 is placed in a "stand-by" state. That is, the block can be brought into "stand-by" state without using a chip selection signal CS or $\overline{CS}$.

As mentioned above, the present invention is characterized in that the most significant binary address signals are used, instead of the chip selection signals as in the prior art, to provide block designating signals for designating a plurality of blocks which comprise a decoder, whereby the current flowing in any block not designated by a block designating signal is reduced substantially to zero.

The present invention can provide a memory circuit with a decoder which comprises a plurality of blocks and in which substantially no current is supplied to any block when the block is not designated.

If the decoder comprises two blocks, the block designating signals $BK_0$ and $\overline{BK_0}$ are generated from the most significant word address signals A. If the decoder comprises four blocks as shown in FIG. 3A, the block designating signal $BK_0$ may be a logical sum of the most significant word address $WA_{n-1}$ and the second most significant word address bit $WA_{n-2}$.

I claim:

1. A memory circuit operatively connected to receive address signals and operatively connectable to a voltage source, comprising:
   a plurality of word lines;
   a plurality of bit lines;
   a plurality of memory cells located at the intersections of said word lines and said bit lines;
   a decoder having a plurality of blocks, for selecting one of said word lines or said bit lines, each of said plurality of blocks including a plurality of decoder circuits, each of said decoder circuits comprising:
   a plurality of MOS transistors, connected in parallel to each other and connected to the voltage source, having gates, respectively, operatively connected to receive one of the address signals; and
   switching means, operatively connected to said MOS transistors, for selectively connecting said MOS transistors to the voltage source; and
   signal generating means, operatively connected to said switching means, for generating a block selecting signal and providing the block selecting signal to said switching means so as to select one of said blocks.

2. A memory circuit according to claim 1, wherein said plurality of MOS transistors in each of said decoder circuits form NAND gates.

3. A memory circuit operatively connected to receive address signals, each of the address signals including a plurality of bits and having a first portion and a second portion, said memory circuit comprising:
   a memory array having word lines;
   a decoder operatively connected to said word lines and divided into blocks of decoder circuits, each of said blocks of decoder circuits receiving the first portion of one of the address signals and each of said blocks of decoder circuits capable of decoding the first portion of one of the address signals and activating one of the word lines; and
   a block selection circuit, operatively connected to said blocks of decoder circuits and operatively connected to receive the second portion of said one of the address signals, for activating one of said blocks of decoder circuits in said decoder.

* * * * *

UNITED STATES PATENT AND TRADEMARK OFFICE
CERTIFICATE OF CORRECTION

PATENT NO. : 4,470,133
DATED : SEPTEMBER 4, 1984
INVENTOR(S) : KAZUO TANIMOTO

It is certified that error appears in the above-identified patent and that said Letters Patent is hereby corrected as shown below:

Col. 1, line 11, "memory" should be --a memory--;
line 40, "$\overline{CS}$" should be --$\overline{CS}$ is--.

Col. 2, line 38, after "to" insert --an embodiment of--;
line 59, "$W_j$" should be --or word lines $W_j$--;
line 60, "line" should be --lines--.

Col. 6, line 6, "brought into" should be --placed in a--.

Signed and Sealed this

Ninth Day of April 1985

[SEAL]

Attest:

DONALD J. QUIGG

Attesting Officer   Acting Commissioner of Patents and Trademarks